United States Patent
Lee

(10) Patent No.: US 9,184,137 B2
(45) Date of Patent: Nov. 10, 2015

(54) SEMICONDUCTOR CHIP AND SEMICONDUCTOR PACKAGE HAVING THE SAME

(71) Applicant: SK hynix Inc., Icheon-si Gyeonggi-do (KR)

(72) Inventor: Seung Yeop Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 17 days.

(21) Appl. No.: 13/738,627

(22) Filed: Jan. 10, 2013

(65) Prior Publication Data

US 2014/0061866 A1 Mar. 6, 2014

(30) Foreign Application Priority Data

Aug. 30, 2012 (KR) .................. 10-2012-0095311

(51) Int. Cl.
*H01L 23/552* (2006.01)
*H01L 23/538* (2006.01)
*H01L 25/065* (2006.01)
*H01L 23/48* (2006.01)

(52) U.S. Cl.
CPC ............ *H01L 23/552* (2013.01); *H01L 23/481* (2013.01); *H01L 25/0657* (2013.01); *H01L 23/5384* (2013.01); *H01L 2224/0401* (2013.01); *H01L 2224/05552* (2013.01); *H01L 2224/05572* (2013.01); *H01L 2224/13025* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06537* (2013.01); *H01L 2225/06565* (2013.01); *H01L 2924/00014* (2013.01); *H01L 2924/15311* (2013.01)

(58) Field of Classification Search
CPC .............. H01L 23/552; H01L 23/5225; H01L 23/5384; H01L 23/538; H01L 2924/3025; H01L 2924/01079; H01L 2924/01078; H01L 21/67121; H01L 24/01; H01L 2221/68313; H01L 2223/54486; H01L 2224/01; H01L 2224/04105; H01L 2224/12105; H01L 2225/06582
USPC ............ 257/621, 659, 422, 508; 438/51, 121, 438/731, 15, 25, 26.55, 64, 106
See application file for complete search history.

(56) References Cited

U.S. PATENT DOCUMENTS

| | | | |
|---|---|---|---|
| 2009/0309169 A1* | 12/2009 | Wu | 257/390 |
| 2010/0224969 A1* | 9/2010 | Tang | 257/660 |
| 2012/0012990 A1* | 1/2012 | Pagaila et al. | 257/659 |
| 2012/0119348 A1* | 5/2012 | Chandra et al. | 257/698 |
| 2012/0139092 A1* | 6/2012 | Su et al. | 257/660 |
| 2013/0292804 A1* | 11/2013 | Lee et al. | 257/621 |
| 2013/0292808 A1* | 11/2013 | Yen et al. | 257/660 |

* cited by examiner

*Primary Examiner* — Julio J Maldonado
*Assistant Examiner* — Moazzam Hossain
(74) *Attorney, Agent, or Firm* — William Park & Associates Ltd.

(57) ABSTRACT

A semiconductor chip includes a semiconductor substrate having one surface, the other surface which faces away from the one surface, and an integrated circuit which is formed on the one surface; and a shielding layershielding layer formed in the semiconductor substrate to correspond to the other surface.

21 Claims, 10 Drawing Sheets

SEMICONDUCTOR CHIP AND SEMICONDUCTOR PACKAGE HAVING THE SAME

CROSS-REFERENCE TO RELATED APPLICATIONS

The present application claims priority under 35 U.S.C. 119(a) to Korean Patent Application Number 10-2012-95311 filed in the Korean intellectual property office on Aug. 30, 2012, which is incorporated herein by reference in its entirety.

BACKGROUND

1. Field of the Invention

The present invention generally relates to a semiconductor device, and more particularly, to a semiconductor chip suitable for improving an EMI (electro-magnetic interference) characteristic and a semiconductor package having the same.

2. Description of the Related Art

These days, the electronic industry trends to manufacture products at reduced costs with high reliability in such a way as to accomplish light weight, miniaturization, high speed operation, multi-functionality and high performance. A package assembly technology is considered as one of important technologies for achieving purposes of designing such products. The package assembly technology is to protect from outside circumstances, a semiconductor chip having integrated circuits formed therein and to easily mount the semiconductor chip to a substrate so that operational reliability of the semiconductor chip can be secured.

Recently, as the operation speed of a semiconductor device increases, a large amount of electro-magnetic waves is generated in a semiconductor chip, so the reliability of an electronic appliance manufactured using the semiconductor chip is likely to deteriorate. That is to say, electro-magnetic waves are inevitably generated in a semiconductor chip which has integrated circuits operating at a high speed. In the case where such a semiconductor chip is used in an electronic appliance, as the electro-magnetic waves generated from the semiconductor chip are radiated, electro-magnetic interference (EMI) may be caused in other electronic products which are mounted to the electronic appliance. As a consequence, electro-magnetic noise or a fail such as a mis-operation may be caused in the electronic appliance in which the semiconductor chip is used, whereby the reliability of the electronic appliance may be degraded. In particular, as the responding speed of the semiconductor chip increases and the semiconductor chip has high capacity, the problem of the electro-magnetic interference due to the radiation of electro-magnetic waves becomes serious.

As a way of blocking such electro-magnetic waves, a method of forming a shielding layer on a molding part of a semiconductor package after assembling a semiconductor chip into the semiconductor package has been suggested. However, even in this case, a problem is caused in that the size of the semiconductor package increases due to the presence of the shielding layer formed on the molding part of the semiconductor package. In addition, it is impossible to solve the problem of the electro-magnetic interference between semiconductor chips and between a semiconductor chip and a substrate in the semiconductor package.

SUMMARY

Various embodiments are directed to a semiconductor chip suitable for improving an EMI (electro-magnetic interference) characteristic and accomplishing light weight, slimness, compactness and miniaturization.

Also, an embodiment is directed to a semiconductor package having the semiconductor chip.

In an embodiment, a semiconductor chip includes: a semiconductor substrate having one surface, the other surface which faces away from the one surface, and an integrated circuit which is formed on the one surface; and a shielding layer formed in the semiconductor substrate to correspond to the other surface.

The semiconductor chip may further include first through electrodes passing through the semiconductor substrate and the shielding layer and electrically connected with the integrated circuit; and a dielectric layer electrically isolating the first through electrodes and the shielding layer from each other. The semiconductor substrate may be divided into a core region where the integrated circuit is disposed and a peripheral region which is defined outside the core region, and the first through electrodes may be formed in the core region.

The semiconductor chip may further include second through electrode passing through the semiconductor substrate and the shielding layer and electrically connected with the shielding layer. The semiconductor substrate may be divided into a core region where the integrated circuit is disposed and a peripheral region which is defined outside the core region, and the second through electrode may be formed in the peripheral region. the second through electrode may be formed in a plural number along edges of the core region.

The shielding layer may be formed to be separated from the other surface of the semiconductor substrate by a predetermined distance. Unlike this, the shielding layer is formed to be exposed on the other surface of the semiconductor substrate.

The semiconductor chip may further include an additional shielding layer formed on side surfaces of the semiconductor substrate and electrically connected with the shielding layer; and a dielectric layer formed between the additional shielding layer and the side surfaces of the semiconductor substrate.

The semiconductor substrate may further have grooves which are defined on side surfaces of the semiconductor substrate, connect the one surface and the other surface with each other and expose the shielding layer. The semiconductor chip may further include an additional shielding layer formed in the grooves and electrically connected with the shielding layer; and a dielectric layer formed between the shielding layer and the semiconductor substrate.

In an embodiment, a semiconductor package includes a semiconductor chip, the semiconductor chip including: a semiconductor substrate having one surface, the other surface which faces away from the one surface, and an integrated circuit which is formed on the one surface; and a shielding layer formed in the semiconductor substrate to correspond to the other surface.

The semiconductor chip may further include first through electrodes passing through the semiconductor substrate and the shielding layer and electrically connected with the integrated circuit; and second through electrode passing through the semiconductor substrate and the shielding layer and electrically connected with the shielding layer.

The semiconductor package may further include a structural body having connection electrodes which are electrically connected with the first through electrodes and ground electrodes which are electrically connected with the second through electrodes.

The semiconductor chip may be disposed such that the other surface of the semiconductor substrate faces the structural body and the one surface of the semiconductor substrate faces away from the structural body. Unlike this, the semiconductor chip may be disposed such that the one surface of the semiconductor substrate faces the structural body and the other surface of the semiconductor substrate faces away from the structural body.

A plurality of semiconductor chips may be stacked by the medium of first and second through electrodes. The semiconductor package may further include a structural body having connection electrodes which are electrically connected with the first through electrodes of a lowermost semiconductor chip among the stacked semiconductor chips and ground electrodes which are electrically connected with the second through electrodes of the lowermost semiconductor chip.

The stacked semiconductor chips may be disposed such that the other surface of each semiconductor substrate faces the structural body and the one surface of each semiconductor substrate faces away from the structural body. Unlike this, the stacked semiconductor chips may be disposed such that the one surface of each semiconductor substrate faces the structural body and the other surface of each semiconductor substrate faces away from the structural body. Additionally, a lowermost semiconductor chip among the stacked semiconductor chips may be disposed such that the other surface of the semiconductor substrate faces the structural body and the one surface of the semiconductor substrate faces away from the structural body, and an uppermost semiconductor chip among the stacked semiconductor chips may be disposed such that the one surface of the semiconductor substrate faces the structural body and the other surface of the semiconductor substrate faces away from the structural body.

DETAILED DESCRIPTION

Hereafter, various embodiments will be described in detail with reference to the accompanying drawings.

It is to be understood herein that the drawings are not necessarily to scale and in some instances proportions may have been exaggerated in order to more clearly depict certain features of the invention.

Figure 1:
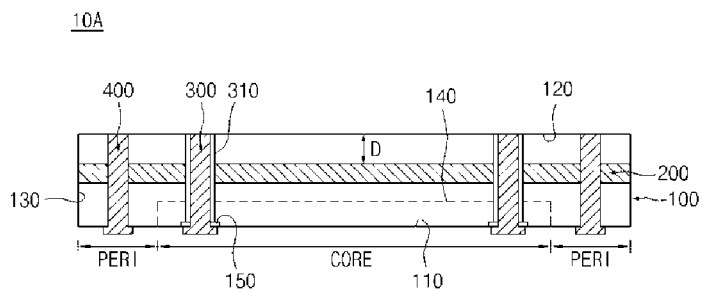
FIG. 1 is a cross-sectional view illustrating a semiconductor chip in accordance with an embodiment.
Figure 2:
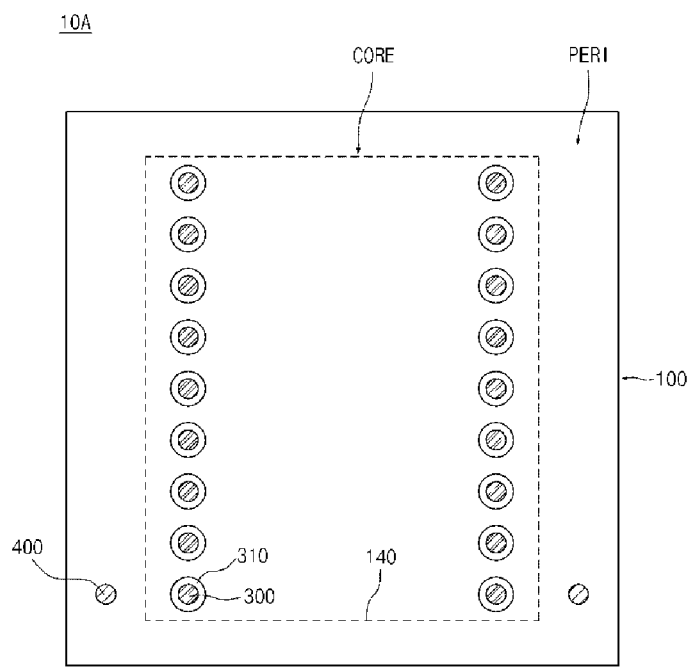
FIG. 2 is a plan view illustrating the semiconductor chip of FIG. 1.

FIG. 1 is a cross-sectional view illustrating a semiconductor chip in accordance with an embodiment, and FIG. 2 is a plan view illustrating the semiconductor chip of FIG. 1.

In an embodiment associated with FIGS. 1 and 2, the semiconductor chip 10A may include a semiconductor substrate 100 and a shielding layer 200. Besides, the semiconductor chip 10A further may include first through electrodes 300 and second through electrodes 400.

The semiconductor substrate 100 may be divided into a core region CORE and a peripheral region PERI, and may have one surface 110, the other surface 120, side surfaces 130, an integrated circuit 140 and bonding pads 150.

The one surface 110 faces away from the other surface 120, and the side surfaces 130 connect the one surface 110 and the other surface 120 with each other. The integrated circuit 140 is formed in the core region CORE on the one surface 110, and may include elements such as transistors, capacitors, resistors, and the likes for storing, processing and transmitting data. Bonding pads 150 may be electrical contacts of the integrated circuit 140 for connection to an outside may be formed in the core region CORE on the one surface 110.

The shielding layer 200 may function to block electromagnetic waves in such a manner that the electro-magnetic waves generated in the integrated circuit 140 are prevented from being radiated outward or the electromagnetic waves generated in an external device are prevented from entering the integrated circuit 140. The shielding layer 200 may be formed in the semiconductor substrate 100 to correspond to the other surface 120 of the semiconductor substrate 100 and may block the integrated circuit 140 and the other surface 120 from each other.

In an embodiment associated with FIGS. 1 and 2, the shielding layer 200 may be formed to be separated from the other surface 120 of the semiconductor substrate 100 by a predetermined distance D. The shielding layer 200 has substantially the same shape as the semiconductor substrate 100 when viewed from the top, and according to this fact, the semiconductor substrate 100 is divided into two parts by the shielding layer 200.

Although it is illustrated and explained in an embodiment associated with FIGS. 1 and 2 that the shielding layer 200 may be formed to be separated from the other surface 120 of the semiconductor substrate 100, the shielding layer 120 may be formed to contact the other surface 120 of the semiconductor substrate 100, and in this case, the shielding layer 200 is exposed on the other surface 120 of the semiconductor substrate 100.

The shielding layer 200 may be formed, for example, by implanting metal or nonmetal ions into the semiconductor substrate 100 through the other surface 120 of the semiconductor substrate 100 through an implant process. The distance D between the other surface 120 of the semiconductor substrate 100 and the shielding layer 200 may be controlled by ion implantation energy. The metal ions may form a metallic substance by reacting with the semiconductor substance included in the semiconductor substrate 100, and may include copper (Cu), aluminum (Al), etc. The nonmetal ions may generate holes or extra electrons by coupling with the semiconductor substance included in the semiconductor substrate 100. As the nonmetal ions couple with the semiconductor substance included in the semiconductor substrate 100, a conductive shielding layer may be formed. While not shown in the drawing, a dielectric layer may be additionally formed between the semiconductor substrate 100 and the shielding layer 200.

The first through electrodes 300 are to input and output signals to and from the integrated circuit 140, and pass through the semiconductor substrate 100 and the shielding layer 200 in the core region CORE and are electrically connected with the integrated circuit 140. In order to electrically isolate the first through electrodes 300 and the shielding layer 200 from each other, a dielectric layer 310 may be formed between the first through electrodes 300 and the shielding layer 200.

The second through electrodes 400 are to apply a ground voltage GND to the shielding layer 200. In an embodiment associated with FIGS. 1 and 2, the second through electrodes 400 pass through the semiconductor substrate 100 and the shielding layer 200 in the peripheral region PERI and are electrically connected with the shielding layer 200. Although it is illustrated and explained in an embodiment associated with FIGS. 1 and 2 that the second through electrodes 400 are formed only in the peripheral region PERI, the second through electrodes 400 may be formed also in the core region CORE. In this case, in order to electrically isolate the integrated circuit 140 and the second through electrodes 400 from each other, a dielectric layer (not shown) is additionally formed between the integrated circuit 140 and the second through electrodes 400.

The ground voltage GND may be applied to the shielding layer 200 through the second through electrodes 400. According to this fact, the electro-magnetic waves generated in the integrated circuit 140 are blocked by the shielding layer 200 and are not radiated toward the other surface 120 of the semiconductor substrate 100, and the electro-magnetic waves incident on the other surface 120 of the semiconductor substrate 100 are blocked by the shielding layer 200 and are not transferred to the integrated circuit 140.

Figure 3:
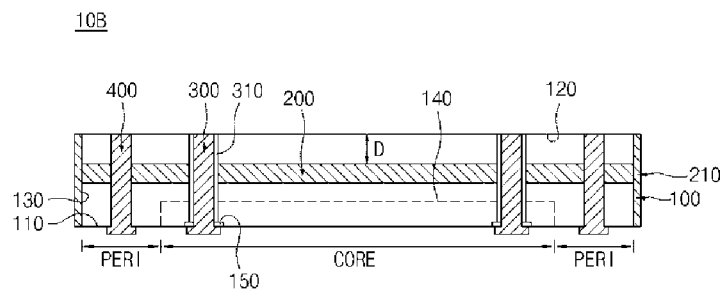
FIG. 3 is a cross-sectional view illustrating a semiconductor chip in accordance with an embodiment.
Figure 4:
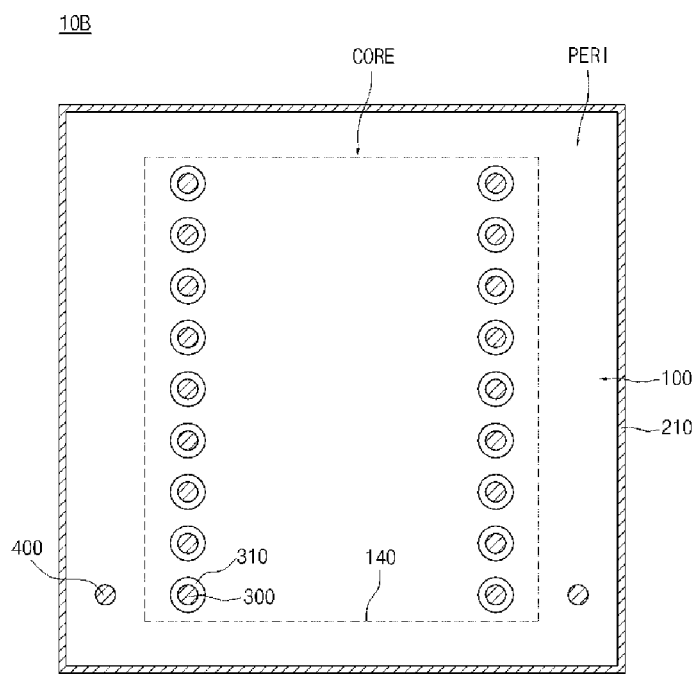
FIG. 4 is a plan view illustrating the semiconductor chip of FIG. 3.

FIG. 3 is a cross-sectional view illustrating a semiconductor chip in accordance with an embodiment, and FIG. 4 is a plan view illustrating the semiconductor chip of FIG. 3.

Referring to FIGS. 3 and 4, the semiconductor chip 10B in accordance with an embodiment may have a construction where an additional shielding layer 210 may be added to the semiconductor chip 10A in accordance with an embodiment described above with reference to FIGS. 1 and 2. Accordingly, the semiconductor chip 10B in accordance with an embodiment associated with FIGS. 3 and 4 may have substantially the same construction as the semiconductor chip 10A in accordance with an embodiment associated with FIGS. 1 and 2 except for the additional shielding layer 210. Therefore, repeated descriptions for the same component parts will be omitted herein, and the same terms and the same reference numerals will be used to refer to the same component parts.

Referring to FIGS. 3 and 4, the semiconductor chip 10B further may include an additional shielding layer 210 in addition to the construction of the semiconductor chip 10A in accordance with an embodiment associated with FIGS. 1 and 2.

The shielding layer 200 may be formed to be exposed on the side surfaces 130 of the semiconductor substrate 100. The additional shielding layer 210 may be formed on the side surfaces of the semiconductor substrate 100 and may be electrically connected with the shielding layer 200.

The additional shielding layer 210 may be formed by depositing a metal layer on the side surfaces 130 of the semiconductor substrate 100. While not shown in the drawing, in order to electrically isolate the additional shielding layer 210 and the semiconductor substrate 100 from each other, a dielectric layer may be additionally formed between the side surfaces of the semiconductor substrate 100 and the additional shielding layer 210.

According to an embodiment described with reference to FIGS. 3 and 4, because the electro-magnetic waves radiated or emitted through the side surfaces 130 of the semiconductor substrate 100 are blocked by the additional shielding layer 210, the effect of blocking electro-magnetic waves may be further improved.

Figure 5:
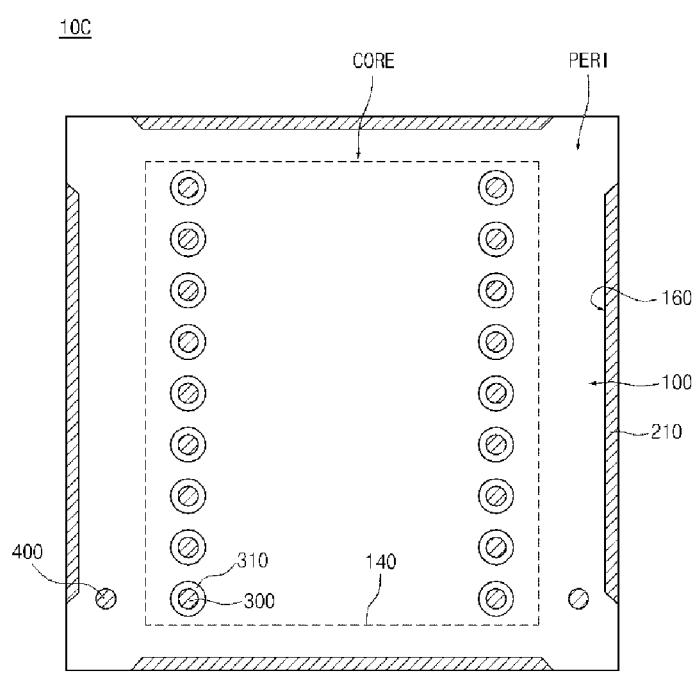
FIG. 5 is a plan view illustrating a semiconductor chip in accordance with an embodiment.

FIG. 5 is a plan view illustrating a semiconductor chip in accordance with an embodiment.

Unlike the semiconductor chip 10B in accordance with an embodiment described above with reference to FIGS. 3 and 4, the semiconductor chip 10C in accordance with an embodiment associated with FIG. 5 may have a construction such that grooves 160 are additionally defined on a semiconductor substrate 100 and an additional shielding layer 210 may be formed in the grooves 160. Accordingly, the semiconductor chip 10C in accordance with an embodiment associated with FIG. 5 may have substantially the same construction as the semiconductor chip 10B in accordance with an embodiment associated with FIGS. 3 and 4 except the substrate 100 and the additional shielding layer 210. Therefore, repeated descriptions for the same component parts will be omitted herein, and the same terms and the same reference numerals will be used to refer to the same component parts.

Referring to FIG. 5, the semiconductor substrate 100 of the semiconductor chip 10C may have grooves 160 which are defined on the side surfaces 130. Additionally, the grooves 160 may be formed on the side surfaces 130 of the semiconductor substrate 100 to connect the one surface 110 and the other surface 120 with each other and expose the shielding layer 210. The additional shielding layer 210 may be formed in the grooves 160 and may be electrically connected with the shielding layer 200.

According to an embodiment described with reference to FIG. 5, since the additional shielding layer 210 may be disposed in the grooves 160 which are defined on the semiconductor substrate 100, an issue capable of increasing the size of a semiconductor chip due to the presence of the additional shielding layer 210 is not raised, and thus, advantages are provided in terms of realizing a light, slim, compact and miniaturized structure.

Figure 6:
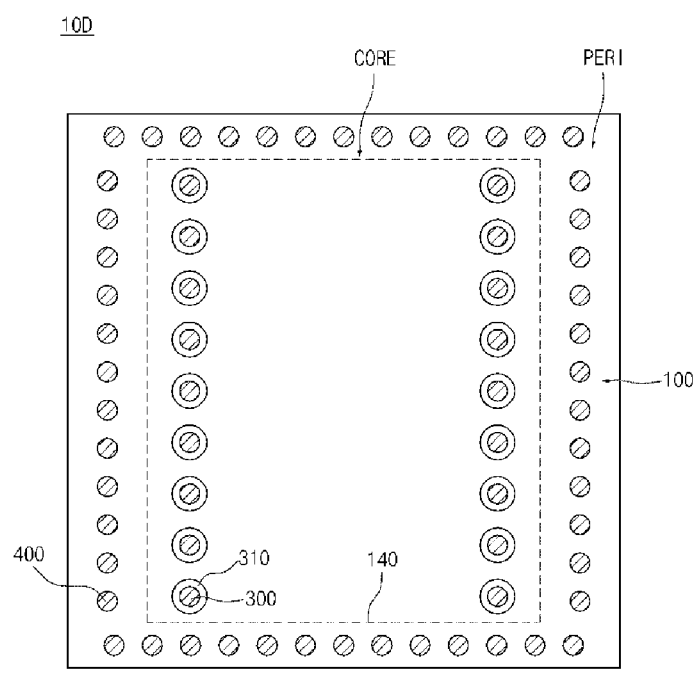
FIG. 6 is a plan view illustrating a semiconductor chip in accordance with an embodiment.

FIG. 6 is a plan view illustrating a semiconductor chip in accordance with an embodiment.

Unlike the semiconductor chip 10A in accordance with an embodiment described above with reference to FIGS. 1 and 2, the semiconductor chip 10D in accordance with an embodiment associated with FIG. 6 has a construction that second through electrodes 400 are formed in a plural number along the edges of a core region CORE. Accordingly, the semiconductor chip 10D in accordance with an embodiment associated with FIG. 6 has substantially the same construction as the semiconductor chip 10A in accordance with an embodiment of associated with FIGS. 1 and 2 except the second through electrodes 400.

Referring to FIG. 6, in the present embodiment, a plurality of second through electrodes 400 are formed in the peripheral region PERI along the edges of the core region CORE, and prevent emission and radiation of electro-magnetic waves through the side surfaces 130 of the semiconductor substrate 100. In order to increase the effect of blocking electro-magnetic waves, the second through electrodes 400 may be densely formed.

Herein below, semiconductor packages having the above-described semiconductor chips will be described.

Figure 7:
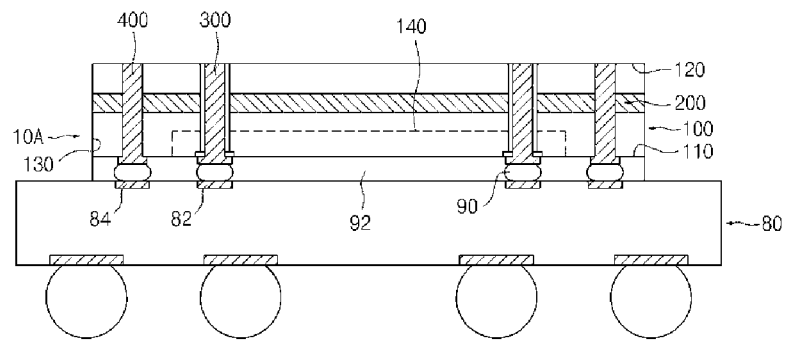
FIG. 7 is a cross-sectional view illustrating a semiconductor package in accordance with an embodiment.

FIG. 7 is a cross-sectional view illustrating a semiconductor package in accordance with an embodiment.

Referring to FIG. 7, after preparing a semiconductor chip 10A having a shielding layer 200 and the first and second through electrodes 300 and 400, the semiconductor chip 10A may be mounted onto a structural body 80 such that the first through electrodes 300 are electrically connected with connection electrodes 82 of the structural body 80 and the second through electrodes 400 may be electrically connected with ground electrodes 84 of the structural body 80. The structural body 80 may comprise a printed circuit board. In an embodiment, the semiconductor chip 10A may be disposed such that one surface 110 of a semiconductor substrate 100 faces the structural body 80 and the other surface 120 of the semiconductor substrate 100 faces away from the structural body 80. Accordingly, since an integrated circuit 140 of the semiconductor chip 10A and the upper part of the semiconductor package are blocked from each other by the shielding layer 200, it is possible to advantageously prevent electro-magnetic interference between the semiconductor chip 10A and the upper part of the semiconductor package.

Conductive connection members 90 may be formed between the first through electrodes 300 of the semiconductor chip 10A and the connection electrodes 82 of the structural body 80, and the second through electrodes 400 of the semiconductor chip 10A and the ground electrodes 84 of the structural body 80 to electrically connect the first through electrodes 300 and the connection electrodes 82 to each other, and the second through electrodes 400 and the ground electrodes to each other. An adhesive member 92 may be formed between the semiconductor chip 10A and the structural body 80 to attach the semiconductor chip 10A and the structural body 80 to each other.

The conductive connection members 90 may be formed using a metal including at least one of copper, tin and silver, and the adhesive member 92 may include any one of a non-conductive film (NCF), a non-conductive paste (NCP), an anisotropic conductive film (ACF), an anisotropic conductive paste (ACP) and polymer.

Figure 8:
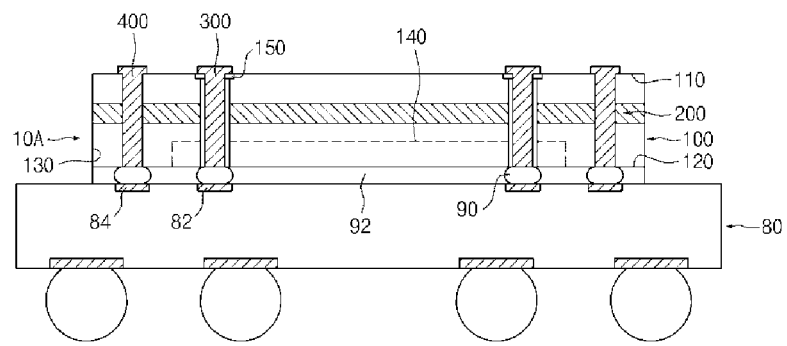
FIG. 8 is a cross-sectional view illustrating a semiconductor package in accordance with an embodiment.

FIG. 8 is a cross-sectional view illustrating a semiconductor package in accordance with an embodiment.

Unlike the semiconductor package in accordance with an embodiment described above with reference to FIG. 7, the semiconductor package in accordance with an embodiment associated with FIG. 8 has a construction that a semiconductor chip 10A is disposed in such a manner that the other surface 120 of a semiconductor substrate 100 faces a structural body 80 and one surface 110 of the semiconductor substrate 100 faces away from the structural body 80. Accordingly, the semiconductor package in accordance with an embodiment associated with FIG. 8 has substantially the same construction as the semiconductor package in accordance with an embodiment associated with FIG. 7 except the layout structure of the semiconductor chip 10A. Therefore, repeated descriptions for the same component parts will be omitted herein, and the same terms and the same reference numerals will be used to refer to the same component parts.

Referring to FIG. 8, after preparing a semiconductor chip 10A having a shielding layer 200 and the first and second through electrodes 300 and 400, the semiconductor chip 10A may be mounted onto a structural body 80 such that the first through electrodes 300 are electrically connected with connection electrodes 82 of the structural body 80 and the second through electrodes 400 are electrically connected with ground electrodes 84 of the structural body 80. In an embodiment associated with FIG. 8, the semiconductor chip 10A may be disposed such that the other surface 120 of a semiconductor substrate 100 faces the structural body 80 and one surface 110 of the semiconductor substrate 100 faces away from the structural body 80. Accordingly, since an integrated circuit 140 of the semiconductor chip 10A and the upper part of the semiconductor package are blocked from each other by the shielding layer 200, it is possible to advantageously prevent electro-magnetic interference between the semiconductor chip 10A and the upper part of the semiconductor package.

Figure 9:
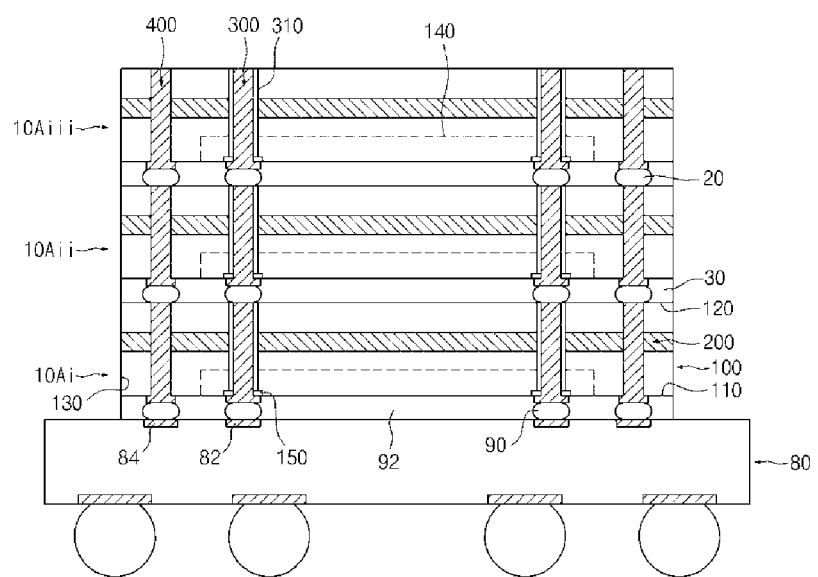
FIG. 9 is a cross-sectional view illustrating a semiconductor package in accordance with an embodiment.

FIG. 9 is a cross-sectional view illustrating a semiconductor package in accordance with an embodiment Referring to FIG. 9, after preparing a plurality of semiconductor chips 10Ai to 10Aiii each having a shielding layer 200 and first and second through electrodes 300 and 400, another semiconductor chip 10Aii may be stacked on one semiconductor chip 10Ai such that the first and second through electrodes 300 and 400 of another semiconductor chip 10Aii are electrically connected with the first and second through electrodes 300 and 400 of one semiconductor chip 10Ai. In this way, the plurality of semiconductor chips, for example, three semiconductor chips 10Ai to 10Aiii are stacked.

Conductive connection members 20 may be formed between the first through electrodes 300 and between the second through electrodes 400 of the stacked semiconductor chips 10Ai to 10Aiii, to electrically connect the first and second through electrodes 300 and 400 of the upper and lower semiconductor chips 10Ai to 10Aiii. Adhesive members 30 may be formed between the stacked semiconductor chips 10Ai to 10Aiii to attach the upper and lower semiconductor chips 10Ai to 10Aiii to one another. The conductive connection members 20 may be formed using a metal including at least one of copper, tin and silver, and the adhesive members 30 may include any one of a non-conductive film (NCF), a non-conductive paste (NCP), an anisotropic conductive film (ACF), an anisotropic conductive paste (ACP) and polymer.

The stacked semiconductor chips 10Ai to 10Aiii may be mounted onto a structural body 80 such that the first through electrodes 300 of the lowermost semiconductor chip 10Ai may be electrically connected with connection electrodes 82 of the structural body 80 and the second through electrodes 400 of the lowermost semiconductor chip 10Ai may be electrically connected with ground electrodes 84 of the structural body 80. In an embodiment associated with FIG. 9, the semiconductor chips 10Ai to 10Aiii may be disposed such that one surface 110 of each semiconductor substrate 100 faces the structural body 80 and the other surface 120 of the semiconductor substrate 100 faces away from the structural body 80. Accordingly, since integrated circuits 140 of the stacked semiconductor chips 10Ai to 10Aiii are blocked from one another by shielding layers 200 and the integrated circuit 140 of the uppermost semiconductor chip 10Aiii and the upper part of the semiconductor package are blocked from each other by the shielding layer 200, it is possible to advantageously prevent electro-magnetic interference between the semiconductor chips 10Ai to 10Aiii and between the uppermost semiconductor chip 10Aiii and the upper part of the semiconductor package.

Conductive connection members 90 may be formed between the first through electrodes 300 of the lowermost semiconductor chip 10Ai and the connection electrodes 82 of the structural body 80, and the second through electrodes 400 of the lowermost semiconductor chip 10Ai and the ground electrodes 84 of the structural body 80 to electrically connect the first through electrodes 300 of the lowermost semiconductor chip 10Ai and the connection electrodes 82 of the structural body 80 to each other, and the second through electrodes 400 of the lowermost semiconductor chip 10Ai and the ground electrodes 84 of the structural body 80 to each other. An adhesive member 92 may be formed between the lowermost semiconductor chip 10Ai and the structural body 80 to attach the lowermost semiconductor chip 10A and the structural body 80 to each other. The conductive connection members 90 may be formed using a metal including at least one of copper, tin and silver, and the adhesive member 92 may include any one of a non-conductive film (NCF), a non-conductive paste (NCP), an anisotropic conductive film (ACF), an anisotropic conductive paste (ACP) and polymer.

Figure 10:
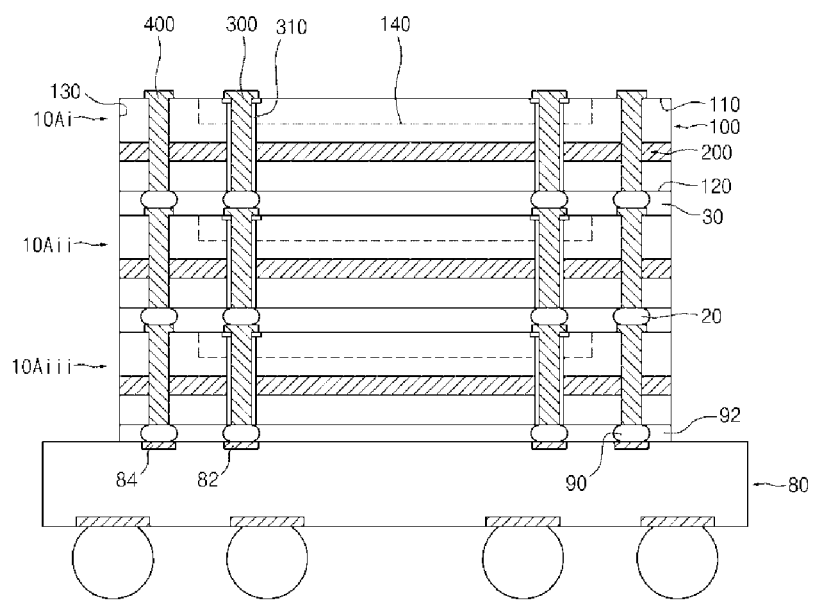
FIG. 10 is a cross-sectional view illustrating a semiconductor package in accordance with an embodiment.

FIG. 10 is a cross-sectional view illustrating a semiconductor package in accordance with an embodiment.

Unlike the semiconductor package in accordance with an embodiment described above with reference to FIG. 9, the semiconductor package in accordance with an embodiment associated with FIG. 10 has a construction that semiconductor chips 10Ai to 10Aiii are disposed in such a manner that the other surfaces 120 of respective semiconductor substrates 100 face a structural body 80 and one surfaces 110 of the semiconductor substrates 100 face away from the structural body 80. Accordingly, the semiconductor package in accordance with an embodiment associated with FIG. 10 has substantially the same construction as the semiconductor package in accordance with an embodiment associated with FIG. 9 except the layout structure of the semiconductor chips 10Ai to 10Aiii. Therefore, repeated descriptions for the same component parts will be omitted herein, and the same terms and the same reference numerals will be used to refer to the same component parts.

Referring to FIG. 10, after preparing a plurality of semiconductor chips 10Ai to 10Aiii each having a shielding layer 200 and first and second through electrodes 300 and 400, another semiconductor chip 10Aii may be stacked on one semiconductor chip 10Ai such that the first and second through electrodes 300 and 400 of another semiconductor chip 10Aii may be electrically connected with the first and second through electrodes 300 and 400 of one semiconductor chip 10Ai. In this way, the plurality of semiconductor chips, for example, three semiconductor chips 10Ai to 10Aiii are stacked.

Conductive connection members 20 may be formed between the first through electrodes 300 and between the second through electrodes 400 of the stacked semiconductor chips 10Ai to 10Aiii, to electrically connect the first and second through electrodes 300 and 400 of the upper and lower semiconductor chips 10Ai to 10Aiii. Adhesive members 30 may be formed between the stacked semiconductor chips 10Ai to 10Aiii to attach the upper and lower semiconductor chips 10Ai to 10Aiii to one another.

The stacked semiconductor chips 10Ai to 10Aiii may be mounted onto a structural body 80 such that the first through electrodes 300 of the lowermost semiconductor chip 10Aiii are electrically connected with connection electrodes 82 of the structural body 80 and the second through electrodes 400 of the lowermost semiconductor chip 10Aiii may be electrically connected with ground electrodes 84 of the structural body 80.

In an embodiment associated with FIG. 10, the semiconductor chips 10Ai to 10Aiii may be disposed such that the other surface 120 of each semiconductor substrate 100 faces the structural body 80 and one surface 110 of the semiconductor substrate 100 faces away from the structural body 80. Accordingly, since integrated circuits 140 of the stacked semiconductor chips 10Ai to 10Aiii are blocked from one another by shielding layers 200 and the integrated circuit 140 of the lowermost semiconductor chip 10Aiii and the structural body 80 are blocked from each other by the shielding layer 200, it is possible to advantageously prevent electro-magnetic interference between the semiconductor chips 10Ai to 10Aiii and between the lowermost semiconductor chip 10Aiii and the structural body 80.

Figure 11:
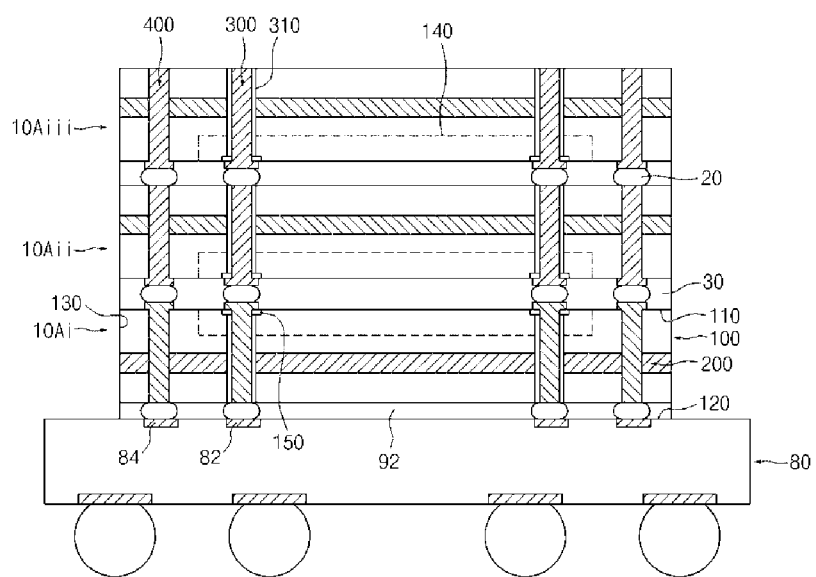
FIG. 11 is a cross-sectional view illustrating a semiconductor package in accordance with an embodiment.

FIG. 11 is a cross-sectional view illustrating a semiconductor package in accordance with an embodiment.

Referring to FIG. 11, after preparing a plurality of semiconductor chips 10Ai to 10Aiii each having a shielding layer 200 and first and second through electrodes 300 and 400, another semiconductor chip 10Aii is stacked on one semiconductor chip 10Ai such that the first and second through electrodes 300 and 400 of another semiconductor chip 10Aii may be electrically connected with the first and second through electrodes 300 and 400 of one semiconductor chip 10Ai. In this way, the plurality of semiconductor chips, for example, three semiconductor chips 10Ai to 10Aiii are stacked.

Conductive connection members 20 may be formed between the first through electrodes 300 and between the second through electrodes 400 of the stacked semiconductor chips 10Ai to 10Aiii, to electrically connect the first and second through electrodes 300 and 400 of the upper and lower semiconductor chips 10Ai to 10Aiii. Adhesive members 30 may be formed between the stacked semiconductor chips 10Ai to 10Aiii to attach the upper and lower semiconductor chips 10Ai to 10Aiii to one another.

The stacked semiconductor chips 10Ai to 10Aiii may be mounted onto a structural body 80 such that the first through electrodes 300 of the lowermost semiconductor chip 10Ai may be electrically connected with connection electrodes 82 of the structural body 80 and the second through electrodes 400 of the lowermost semiconductor chip 10Ai may be electrically connected with ground electrodes 84 of the structural body 80. In an embodiment associated with FIG. 11, the lowermost semiconductor chip 10Ai may be disposed such that the other surface 120 of a semiconductor substrate 100 faces the structural body 80 and one surface 110 of the semiconductor substrate 100 faces away from the structural body 80, and the uppermost semiconductor chip 10Aiii may be disposed such that one surface 110 of a semiconductor substrate 100 faces the structural body 80 and the other surface 120 of the semiconductor substrate 100 faces away from the structural body 80. Accordingly, since integrated circuit 140 of the lowermost semiconductor chip 10Ai and the structural body 80 are blocked from each other by the shielding layer 200 and the uppermost semiconductor chip 10Aiii and the upper part of the semiconductor package are blocked from each other by the shielding layer 200, it is possible to advantageously prevent electro-magnetic interference between the semiconductor chips 10Ai to 10Aiii and the structural body 80 and between semiconductor chips 10Ai to 10Aiii and the upper part of the semiconductor package.

While it was explained in the embodiments described above with reference to FIGS. 7 to 11 that the structural body 80 may include a printed circuit board, it is to be noted that the structural body 80 may include a semiconductor package or an interposer.

Although it was illustrated and explained in the embodiments described above with reference to FIGS. 7 to 11 that a semiconductor package may be constructed using the semiconductor chip 10A shown in FIGS. 1 and 2, the present embodiments are not limited to such, and a person having ordinary skill in the art will appreciate that a semiconductor package may be constructed using the semiconductor chips 10B, 10C, and 10D shown in FIGS. 3 to 6 instead of the semiconductor chip 10A shown in FIGS. 1 and 2.

The aforementioned semiconductor packages may be applied to various electronic apparatuses.

Figure 12:
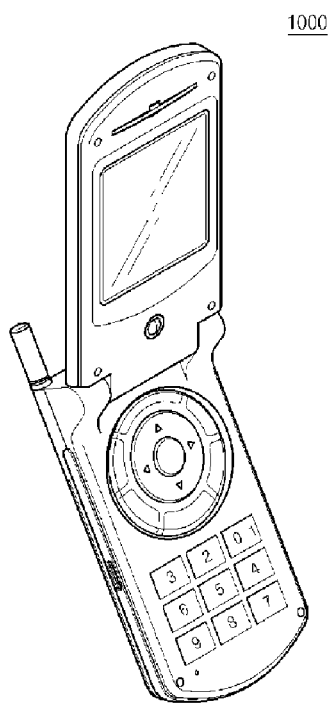
FIG. 12 is a perspective view illustrating an electronic apparatus having the semiconductor package according to the embodiments.

FIG. 12 is a perspective view illustrating an electronic apparatus having the semiconductor package according to the embodiments.

Referring to FIG. 12, the semiconductor package according to the embodiments may be applied to an electronic apparatus 1000 such as a portable phone. Since the semiconductor package according to the embodiments provides advantages in that an EMI characteristic may be improved and it is possible to realize a light, slim, compact, and miniaturized structure, advantages are provided in improving the performance of the electronic apparatus 1000. The electronic apparatus 1000 is not limited to the portable phone shown in FIG. 12, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 13:
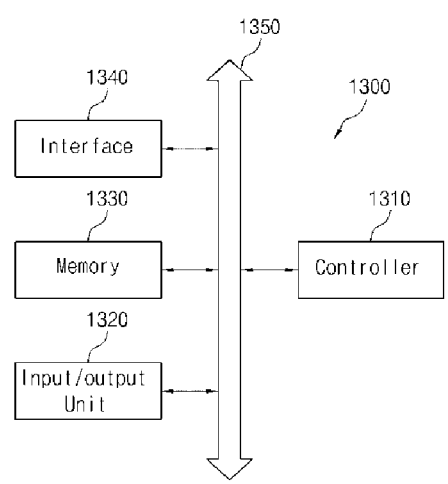
FIG. 13 is a block diagram showing an example of the electronic apparatus having the semiconductor package according to the embodiments.

FIG. 13 is a block diagram showing an example of the electronic apparatus having the semiconductor package according to the embodiments.

Referring to FIG. 13, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the semiconductor package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the embodiments, since a shielding layer may be formed in a semiconductor chip, an issue capable of increasing the size of a semiconductor package due to the presence of the shielding layer is not raised, and thus, it is possible to provide a semiconductor package with a light, slim, compact and miniaturized structure. Moreover, not only electro-magnetic interference between the semiconductor package and an external device but also electro-magnetic interference between semiconductor chips existing in the semiconductor package and between a semiconductor chip and an underlying structural body (for example, a printed circuit board, a package, an interposer, etc.) may be prevented, whereby an EMI characteristic may be improved.

Although various embodiments have been described for illustrative purposes, those skilled in the art will appreciate that various modifications, additions, and substitutions are possible, without departing from the scope and the spirit of the invention as disclosed in the accompanying claims.

What is claimed is:

1. A semiconductor chip comprising:
    a semiconductor substrate having one surface, an other surface which faces away from the one surface, and an integrated circuit which is formed on the one surface;
    a shielding layer formed in the semiconductor substrate to correspond to the other surface; and
    a dielectric layer formed between the shielding layer and first through electrodes,
    the first through electrodes passing through the semiconductor substrate and the shielding layer and the integrated circuit and electrically connected with the integrated circuit through bonding pads, wherein the dielectric layer electrically isolates the first through electrodes from the shielding layer,
    wherein the shielding layer is disposed to be separated from the other surface of the semiconductor substrate by a predetermined distance, and
    wherein the shielding layer comprises a nonmetal, ion-doped portion of the semiconductor substrate,
    wherein the shielding layer is formed by nonmetal ions implanted into the semiconductor substrate.

2. The semiconductor chip according to claim 1, further comprising:
    the first through electrodes passing through the semiconductor substrate and the shielding layer and electrically connected with the integrated circuit.

3. The semiconductor chip according to claim 2,
    wherein the semiconductor substrate is divided into a core region where the integrated circuit is disposed and a peripheral region which is defined outside the core region, and
    wherein the first through electrodes are formed in the core region.

4. The semiconductor chip according to claim 2, further comprising:
    a dielectric layer electrically isolating the first through electrodes and the shielding layer from each other.

5. The semiconductor chip according to claim 1, further comprising:
    a second through electrode passing through the semiconductor substrate and the shielding layer and electrically connected with the shielding layer.

6. The semiconductor chip according to claim 5,
    wherein the semiconductor substrate is divided into a core region where the integrated circuit is disposed and a peripheral region which is defined outside the core region, and
    wherein the second through electrodes are formed in the peripheral region.

7. The semiconductor chip according to claim 6, wherein the second through electrodes are formed in a plural number along edges of the core region.

8. The semiconductor chip according to claim 1, further comprising:
    an additional shielding layer formed on side surfaces of the semiconductor substrate and electrically connected with the shielding layer.

9. The semiconductor chip according to claim 8, further comprising:
a dielectric layer formed between the additional shielding layer and the side surfaces of the semiconductor substrate.

10. The semiconductor chip according to claim 1, wherein the semiconductor substrate further has grooves which are defined on side surfaces of the semiconductor substrate, connect the one surface and the other surface with each other and expose the shielding layer.

11. The semiconductor chip according to claim 10, further comprising:
an additional shielding layer formed in the grooves and electrically connected with the shielding layer.

12. A semiconductor package including a semiconductor chip, the semiconductor chip comprising:
a semiconductor substrate having one surface, an other surface which faces away from the one surface, and an integrated circuit which is formed on the one surface;
a shielding layer formed in the semiconductor substrate to correspond to the other surface; and
a dielectric layer formed between the shielding layer and first through electrodes,
the first through electrodes passing through the semiconductor substrate and the shielding layer and the integrated circuit and electrically connected with the integrated circuit through bonding pads, wherein the dielectric layer electrically isolates the first through electrodes from the shielding layer,
wherein the shielding layer is disposed to be separated from the other surface of the semiconductor substrate by a predetermined distance, and
wherein the shielding layer comprises a nonmetal, ion-doped portion of the semiconductor substrate,
wherein the shielding layer is formed by nonmetal ions implanted into the semiconductor substrate.

13. The semiconductor package according to claim 12, wherein the semiconductor chip further comprises:
the first through electrodes passing through the semiconductor substrate and the shielding layer and electrically connected with the integrated circuit; and
second through electrodes passing through the semiconductor substrate and the shielding layer and electrically connected with the shielding layer.

14. The semiconductor package according to claim 13, further comprising:
a structural body having connection electrodes which are electrically connected with the first through electrodes and ground electrodes which are electrically connected with the second through electrodes.

15. The semiconductor package according to claim 14, wherein the semiconductor chip is disposed such that the other surface of the semiconductor substrate faces the structural body and the one surface of the semiconductor substrate faces away from the structural body.

16. The semiconductor package according to claim 14, wherein the semiconductor chip is disposed such that the one surface of the semiconductor substrate faces the structural body and the other surface of the semiconductor substrate faces away from the structural body.

17. The semiconductor package according to claim 13, wherein a plurality of semiconductor chips are stacked by the medium of first and second through electrodes.

18. The semiconductor package according to claim 17, further comprising:
a structural body having connection electrodes which are electrically connected with the first through electrodes of a lowermost semiconductor chip among the stacked semiconductor chips and ground electrodes which are electrically connected with the second through electrodes of the lowermost semiconductor chip.

19. The semiconductor package according to claim 18, wherein the stacked semiconductor chips are disposed such that the other surface of each semiconductor substrate faces the structural body and the one surface of each semiconductor substrate faces away from the structural body.

20. The semiconductor package according to claim 18, wherein the stacked semiconductor chips are disposed such that the one surface of each semiconductor substrate faces the structural body and the other surface of each semiconductor substrate faces away from the structural body.

21. The semiconductor package according to claim 18, wherein a lowermost semiconductor chip of the stacked semiconductor chips is disposed such that the other surface of the semiconductor substrate faces the structural body and the one surface of the semiconductor substrate faces away from the structural body, and an uppermost semiconductor chip of the stacked semiconductor chips is disposed such that the one surface of the semiconductor substrate faces the structural body and the other surface of the semiconductor substrate faces away from the structural body.

* * * * *